(12) United States Patent
Kawahara et al.

(10) Patent No.: US 6,596,080 B2
(45) Date of Patent: *Jul. 22, 2003

(54) SILICON CARBIDE AND METHOD FOR PRODUCING THE SAME

(75) Inventors: Takamitsu Kawahara, Kawasaki (JP); Hiroyuki Nagasawa, Tokyo (JP); Kuniaki Yagi, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/827,178

(22) Filed: Apr. 6, 2001

(65) Prior Publication Data

US 2002/0014198 A1 Feb. 7, 2002

(30) Foreign Application Priority Data

Apr. 7, 2000 (JP) ........................................ 2000-106292
Nov. 30, 2000 (JP) ........................................ 2000-365443

(51) Int. Cl.[7] .............................................. C30B 25/18
(52) U.S. Cl. ...................................................... 117/106
(58) Field of Search .............................. 117/54, 58, 63, 117/101, 106

(56) References Cited

U.S. PATENT DOCUMENTS

| | | | | |
|---|---|---|---|---|
| 4,912,064 A | * | 3/1990 | Kong et al. | 437/100 |
| 4,946,547 A | * | 8/1990 | Palmour et al. | 156/643 |
| 5,122,223 A | | 6/1992 | Geis et al. | |
| 5,230,768 A | * | 7/1993 | Furukawa et al. | 156/612 |
| 5,248,385 A | | 9/1993 | Powell | |
| 5,501,173 A | | 3/1996 | Burk, Jr. et al. | |
| 5,747,831 A | * | 5/1998 | Loose et al. | 257/77 |
| 5,915,194 A | | 6/1999 | Powell et al. | |
| 6,416,578 B1 | * | 7/2002 | Nakano et al. | 117/94 |

FOREIGN PATENT DOCUMENTS

| | | |
|---|---|---|
| EP | 1 130 135 | 9/2001 |
| JP | 63-270398 | 11/1988 |
| JP | 6-41400 | 6/1994 |
| JP | 2000-178740 | 6/2000 |

OTHER PUBLICATIONS

U.S. patent application Ser. No. 09/515,134, filed Feb. 29, 2000.

M. Shigeta, et at., Applied Physics Letters, vol. 55, No. 15, pp. 1522–1524, "Chemical Vapor Deposition of Single–Crystal Films of Cubic SiC on Patterned Si Substrates", Oct. 9, 1989.

K. Shibahara, et al., Applied Physics Letters, vol. 50, No. 26, pp. 1888–1890, "Antiphase–Domain–Free Growth of Cubic SiC on Si(100)", Jun. 29, 1987.

(List continued on next page.)

*Primary Examiner*—Benjamin L. Utech
*Assistant Examiner*—Matthew A. Anderson
(74) *Attorney, Agent, or Firm*—Oblon, Spivak, McClelland, Maier & Neustadt, P.C.

(57) ABSTRACT

A process for preparation of silicon carbide by depositing silicon carbide on at least a part of a surface of a substrate having on its surface undulations extending approximately in parallel with each other, wherein a center line average of said undulations is in a range of from 3 to 1,000 nm, gradients of inclined planes of said undulations are in a range of from 1° to 54.7°, and, in a cross section orthogonal to a direction along which the undulations are extended, portions at which neighboring inclined planes are brought in contact with each other are in a curve shape. The substrate is silicon or silicon carbide having a surface with a plane normal in a crystallographic <001> orientation, having {001} planes accounting for 10% or less of the entire area of the surface, etc. Also claimed is a single crystal silicon carbide having a planar defect density of 1,000/cm$^2$ or lower, or having an internal stress of 10 MPa or lower.

14 Claims, 6 Drawing Sheets

OTHER PUBLICATIONS

Z. C. Feng, et al., Journal of Applied Physics, vol. 64, No. 12, pp. 6827–6835, XP–000111466, "Raman Determination of Layer Stresses and Strains for Heterostructures and Its Application to the Cubic SiC/Si System", Dec. 15, 1988.

K. Shibahara, et al., Applied Physic Letters, vol. 50, No. 26, pp. 1888–1890, XP–000885091, "Antiphase–Domain–Free Growth of Cubic Sic on Si(100)", Jun. 29, 1987.

M. Shigeta, et al., Applied Physics Letters, vol. 55, No. 15, pp. 1522–1524, XP–000094807, "Chemical Vapor Deposition of Single–Crystal Films of Cubic SiC on Patterned Si Substrates", Oct. 9, 1989.

U.S. patent application Ser. No. 09/867,467, filed May 31, 2001, pending.

U.S. patent application Ser. No. 10/140,187, filed May 8, 2002, pending.

* cited by examiner

K 2.000 μm/DIV
Z 80.000 nm/DIV
DS8 15MICRON DIE POLISHED
ds8-1.001

SILICON CARBIDE AND METHOD FOR PRODUCING THE SAME

BACKGROUND OF THE INVENTION

1. Field of the Invention

The present invention relates to a single crystal silicon carbide useful as an electronic material and to a process for preparation of the same. In particular, the present invention relates to a single crystal silicon carbide having preferred characteristics in fabricating a semiconductor device such as low crystal defect density or small strain in crystal lattice, and to a process for preparation of the same.

2. Background Art

Crystal growth methods for silicon carbide (SiC) employed heretofore can be classified into two methods; one is bulk growth using sublimation method and the other is forming a thin film on a substrate by taking advantage of epitaxial growth.

The bulk growth using sublimation method has enabled polycrystalline polymorphs of high temperature phases, i.e., hexagonal (6H, 4H, etc.) silicon carbide, and it has also realized a substrate of SiC itself. However, this method suffered numerous defects (micropipes) induced inside the crystals, and found difficulty in increasing the area of the substrate.

On the other hand, the use of epitaxial growth on a single crystal substrate advantageously improves the controllability of impurities and realizes substrates with increased area, and overcomes the problem found in the sublimation method by reducing the formation of micro-pipes. Yet, in the epitaxial growth method, however, there is frequently found a problem concerning an increase in stacking fault defects attributed to the difference in lattice constants between the substrate material and the silicon carbide film. In particular, the use of silicon as the substrate to form thereon a silicon carbide leads to a considerable generation of twins and anti phase boundaries (APB) inside the growth layer of silicon carbide, because there is a large lattice mismatch between silicon carbide and the underlying silicon that is generally used as the substrate. Hence, these defects lead to a silicon carbide with inferior characteristics when applied to an electronic element.

As a method for reducing planar defects within the silicon carbide film, there is proposed, for instance, a technique for reducing the planar defects that are present in films having a specific thickness or more, said method comprising a step of forming a growth region on the substrate on which silicon carbide is grown, and a step of growing single crystal silicon carbide on the thus obtained growth region in such a manner that the thickness thereof should become equal to, or greater than, the thickness specific to the crystallographic direction on the growth plane (see JP-B-Hei6-41400, wherein the term "JP-B-" as referred herein signifies "an examined published Japanese Patent Application"). However, since two types of anti phase boundaries that are formed inside silicon carbide tend to be extended with increasing film thickness in directions orthogonal to each other, the anti phase boundaries cannot effectively be reduced. Furthermore, the superstructure that is formed on the surface of the grown silicon carbide cannot be controlled as desired. Thus, if independently grown regions combine with each other, an anti phase boundary that newly generates at the bonded portion unadvantageously impairs the electric characteristics.

As a means for effectively reducing the anti phase boundary, K. Shibahara et al. proposed a growth method of silicon carbide onto an Si (001) surface substrate in which a surface axis normal to the Si (001) plane was slightly tilted from the crystallographic <001> direction to the crystallographic <110> direction (i.e., an offset angle was introduced) (see Applied Physics Letter, vol. 50 (1987) pp.1888). In this method, steps in atomic level are introduced equi-spaced in one direction by slightly tilting the substrate. Thus, planar defects that are provided in parallel with the thus introduced steps are allowed to propagate, whereas the propagation of the planar defects that are present in a direction perpendicular to the steps (i.e., the direction crossing the steps) is effectively suppressed. Accordingly, as film thickness of the silicon carbide increases, among the two anti phase boundaries included in the film, an anti phase boundary extending in the direction parallel to the introduced steps extends in preference to the anti phase boundary extending in the orthogonal direction to the steps. Thus, the anti phase boundaries can be effectively reduced. However, as is shown in FIG. 1, this method induces the generation of undesirable anti phase boundary 1 and twins due to an increase in step density at the boundary between the silicon carbide and the silicon substrate. Hence, this method still suffers from a problem that the anti phase boundaries cannot be completely extinguished. In FIG. 1, numeral 1 represents an anti phase boundary that have generated at the steps of single atoms, numeral 2 denotes a conjunction of anti phase boundaries, numeral 3 denotes an anti phase boundary generated at the terrace on the surface of the silicon substrate, represents an offset angle, and φ is an angle (54.7°) making the Si (001) plane with the antiphase boundary. The antiphase boundary 3 generated at the terrace on the surface of the substrate diminishes at the conjunction 2 of anti phase boundaries. However, the anti phase boundaries 1 generated at the monoatomic steps on the silicon substrate remain as they are because they have no counterparts for association.

Furthermore, in case of forming silicon carbide on the surface of a silicon substrate, an internal stress generates inside the silicon carbide layer due to the difference in the coefficient of thermal expansion between silicon and silicon carbide, to a mismatch in lattice constants, to the generation of defects that form inside silicon carbide, or to the influence of strain. Then, warping or strain generates on the silicon carbide that is formed on the silicon substrate attributed to the internal stress that is generated inside the silicon carbide layer. Hence, such a silicon carbide is unfeasible for use as a material for producing semiconductor devices.

In the light of such circumstances, an object of the present invention is to provide a process for producing a silicon carbide in which the anti phase boundaries are effectively reduced, and a process for producing a silicon carbide, in which the warping and strain attributed to internal stress are reduced.

Furthermore, another object of the present invention is to provide a single crystal silicon carbide reduced in anti phase boundaries and/or in warping and strain attributed to internal stress, and to a process for producing the same.

SUMMARY OF THE INVENTION

The aforementioned objects can be achieved by the present invention as follows.

In accordance with a first aspect of the present invention, there is provided a process for preparation of silicon carbide by depositing silicon carbide on at least a part of a surface of a substrate having on its surface undulations extending approximately in parallel with each other, wherein a center line average of said undulations is in a range of from 3 to 1,000 nm, gradients of inclined planes of said undulations are in a range of from 1° to 54.7°, and, in a cross section orthogonal to a direction along which the undulations are extended, portions at which neighboring inclined planes are brought in contact with each other are in a curve shape.

In accordance with a second aspect of the present invention, there is provided a process for preparation of silicon carbide by depositing silicon carbide on at least a part of a surface of a substrate having on its surface undulations extending approximately in parallel with each other, wherein a center line average of said undulations is in a range of from 3 to 1,000 nm, gradients of inclined planes of said undulations are in a range of from 1° to 54.7°, and said substrate is made of silicon or silicon carbide having a surface with a plane normal axis of <001> crystallographic direction and with an area of {001} planes equal to or less than 10% of the entire area of the surface of said substrate.

According to a third aspect of the present invention, there is provided a process for preparation of silicon carbide by depositing silicon carbide on at least a part of a surface of a substrate having on its surface undulations extending approximately in parallel with each other, wherein a center line average of said undulations is in a range of from 3 to 1,000 nm, gradients of inclined planes of said undulations are in a range of from 1° to 54.7°, and said substrate is made of silicon or cubic silicon carbide having a surface with a plane normal axis of <111> crystallographic direction and with an area of {111} planes equal to or less than 3% of the entire area of the surface of said substrate.

In accordance with a fourth aspect of the present invention, there is provided a process for preparation of silicon carbide by depositing silicon carbide on at least a part of a surface of a substrate having on its surface undulations extending approximately in parallel with each other, wherein a center line average of said undulations is in a range of from 3 to 1,000 nm, gradients of inclined planes of said undulations are in a range of from 1° to 54.7°, and said substrate is made of hexagonal silicon carbide having a surface with a plane normal axis of <1,1,−2,0> crystallographic direction and with an area of {1,1,−2,0} planes equal to or less than 10% of the entire area of the surface of said substrate.

According to a fifth aspect of the present invention, there is provided a process for preparation of silicon carbide by depositing silicon carbide on at least a part of a surface of a substrate having on its surface undulations extending approximately in parallel with each other, wherein a center line average of said undulations is in a range of from 3 to 1,000 nm, gradients of inclined planes of said undulations are in a range of from 1° to 54.7°, and said substrate is made of hexagonal silicon carbide having a surface with a plane normal axis of <0,0,0,1> crystallographic direction and with an area of {0,0,0,1} planes equal to or less than 3% of the entire area of the surface of said substrate.

In accordance with a sixth aspect of the present invention, there is provided a process for preparation according to one of the first to fifth aspects above, wherein said silicon carbide is deposited from a vapor phase or a liquid phase.

In accordance with a seventh aspect of the present invention, there is provided a process for preparation according to one of the second to fifth aspects above, wherein, in a cross section orthogonal to a direction along which the undulations are extended, portions at which neighboring inclined planes are brought in contact with each other are in a curve shape.

In accordance with an eighth aspect of the present invention, there is provided a single crystal silicon carbide having a planar defect density equal to or less than 1,000 defects/cm$^2$.

According to a ninth aspect of the present invention, there is provided a single crystal silicon carbide having an internal stress equal to or less than 100 MPa.

According to a tenth aspect of the present invention, there is provided a single crystal silicon carbide having a planar defect density equal to or less 1,000 defects/cm$^2$ and an internal stress equal to or less 100 MPa.

According to an eleventh aspect of the present invention, there is provided a single crystal silicon carbide having an etch pit density equal to or less than 10/cm$^2$ and a twin density equal to or less than $4 \times 10^{-4}$% by volume.

According to a twelfth aspect of the present invention, there is provided a process for preparation of the single crystal silicon carbide of one of eight to eleventh aspects above in accordance with any of the processes for preparation of first to seventh aspects above, wherein silicon carbide is epitaxially grown so as to maintain the crystallinity of the surface of the substrate to obtain the single crystal silicon carbide.

First Aspect

According to a first aspect of the present invention, a substrate having a plurality of undulations extending approximately in parallel with each other on the surface thereof is used as the substrate. By thus using a substrate having a plurality of undulations on the surface thereof, the effect of introducing an offset angle as described by K. Shibahara et al. can be achieved at the each inclined surfaces of the undulations. Furthermore, by using a substrate having a plurality of undulations on the surface thereof, the planar defects that are incorporated in the silicon carbide deposited on the substrate can be ameliorated as to minimize the strain, and the internal stress of the silicon carbide can be thereby reduced.

The undulations as referred in the present invention do not strictly require that they have mathematically defined parallelism or mirror plane symmetry, but that they have such a morphology sufficient for effectively reducing or diminishing the anti phase boundary. In addition, the undulations of the present invention are not atomic steps but are in a macro size compared to the atomic steps. This is because the undulations have a center line average 3 nm at the minimum, as mentioned below in detailed.

The undulations as referred in the present invention are constituted with repeated groove and ridge portions and the ridge portion has slopes (tilted or inclined planes) with gradient with respect to the base surface ranging from 1° to 54.7°. The slopes of neighboring ridge portions are facing each other through the groove portions. Preferably, the undulations of the substrate surface is formed so as to fall integrated gradient angles of the slope with respect to the base surface in substantially zero, wherein the integration is made through the whole surface.

In the present invention, a silicon carbide layer is successively formed on the whole substrate surface or a part of the substrate surface, provided that such a part has the above-mentioned undulations. Since the substrate surface of the present invention has the undulations with the shape mentioned above, anti phase boundaries generated and grown at steps on the slopes with the growth of silicon carbide would associate each other between the undulations and thereby the anti phase boundaries are effectively eliminated to yield a single crystal silicon carbide with less defects.

The undulations that are formed on the surface of the substrate have a center line average in a range of from 3 to 1,000 nm. The undulations with a center line average of less than 3 nm is insufficient, because an effective offset angle cannot be obtained, and this leads to defects generated at a high density. If the centerline roughness should exceed 1,000 nm, the probability of causing collision between planar defects and thereby extinguishing them becomes low, and the effect of the present invention cannot be achieved. Thus, the surface of the substrate should have a center line average of 3 nm or higher but 1,000 nm or lower. To achieve the effect of the present invention in a further effective manner, the center line average is preferably 10 nm or higher but 100 nm or lower.

The center line average (Ra) used herein is that defined in JISBO601-1982. The definition of Rain the JIS is as follows: in a case, a portion has a measured length of "L" and is picked up from a roughness curve to the centerline, supposing the centerline of the picked-up portion as axis X, the direction of lengthwise amplification as axis Y, and roughness curve as y=f(x), the center line average (Ra) is defined as the following equation represented in micrometer.

$$Ra = (1/L) \int_0^1 |f(x)| dx$$

The unit of center line average defined in JIS B0601-1982 is micrometer but the unit of center line average used in this invention is nanometer (nm).

The center line average of the surface of the substrate is measured by using an atomic force microscope (AFM).

Furthermore, the angle of the tilted planes of the undulations extending on the surface of the substrate above falls in a range of 1° or higher but not higher than 54.7°.

In the process according to the present invention, the effect of the invention is exhibited by accelerating the growth of silicon carbide in the vicinity of the steps formed in atomic level on the surface of the substrate. Thus, present invention is realized in case the tilt angle of (111) plane of the undulations falls at an angle of 54.7° or lower, at which the entire surface of the tilted plane is completely covered by a single step. In case where the gradient is provided at a tilt angle of less than 1°, the step density on the tilted plane of the undulations becomes extremely low. Hence, the gradient of the tilted planes of the undulations should be set at an angle of 1° or higher. From the view point of realizing the effect of the present invention in a further effective manner, the tilt angle of the tilted planes of the undulations is preferably 2° or higher but not higher than 10°.

In the present invention, the term "the tilted plane of the undulations" refers to planes having any morphology, such a flat planes, curved planes, etc. Furthermore, in the present invention, the term "tilt angle of the tilted planes of the undulations" signifies the tilt angle of the tilted angle substantially contributing to the effect of the present invention, and it refers to an average tilt angle of the tilted planes. The tern "average tilt angle" signifies the angle that is made by the plane along the crystallographic orientation and the tilted plane (an average value for the evaluated region).

Further, in a cross section orthogonal to a orientation along which the undulations are extended, portions at which neighboring inclined planes are brought in contact with each other are in a curve shape. The portion at which the neighboring tilted planes are brought into contact with each other refers to the groove portion and the ridge portion of the undulations extending on the surface of the substrate, and the bottom of the groove as well as the apex of the ridge is provided in a curved shape. This state can be understood from the AFM image shown in FIG. 4. More specifically, the cross section of the undulations as observed on the cross section orthogonal to the orientation along which the undulations are extended exhibits a shape similar to a sinusoidal wave, although the wavelength and the height of the wave not necessarily yield constant values. Thus, the density of planar defects can be reduced by thus providing bottom portions of the groove and the apex of the ridge with curved cross sections.

Thus, by providing a plurality of undulations on the surface of the substrate on which silicon carbide is grown as described above, the effect of introducing offset angles as shown by K. Shibahara et al. can be realized at each of the tilted planes of each of the undulations. From the viewpoint of the limits of the etching technology in forming undulations on the substrate, the interval between the apices of the undulations is preferably 0.01 $\mu$m or larger. On the other hand, since the frequency of causing association of the anti phase boundaries greatly decreases in case the interval between the apices of the undulations exceeds 1,000 $\mu$m, the interval between the apices of the undulations is preferably 1,000 $\mu$m or smaller. Furthermore, from the viewpoint of sufficiently exhibiting the effect of the present invention, the preferred interval between the apices of the undulations is 0.1 $\mu$m or larger, but not more than 100 $\mu$m.

The height difference and the interval between the undulations affect the gradient of the undulations, i.e., the step density. Since the preferred step density depends on the conditions of crystal growth, it cannot be limited to a specific value, however, in general, the height difference of the undulations is approximately the same as the interval between the apices of the undulations; that is, the height is preferably 0.01 $\mu$m or larger, but not more than 20 $\mu$m.

In accordance with the first aspect of the present invention, usable as the materials for the substrate are, for instance, single crystal substrates such as those of silicon or silicon carbide, or of sapphire.

Further according to the first aspect of the present invention, silicon carbide is deposited on at least a part of the surface of the substrate.

Those described above are also common to other aspects of the present invention that are described hereinafter.

Second Aspect

Similar to the first aspect described above, in the second aspect according to the present invention, used as the substrate for depositing thereon silicon carbide is a substrate having a plurality of undulations extended approximately in parallel with each other on the surface thereof, said undulations having a center line average in a range of from 3 to 1,000 nm, and having tilted planes having a tilt angle in a range of from 1° to 54.7°. The reasons for limiting the center line average of the undulations above to a certain range, for setting a preferred range thereof; or the reasons for limiting the tilt angle of the tilted planes of the undulations, for setting a preferred range thereof; as well as the other points that are set in common, are the same as those described above in the first aspect of the present invention. In the second aspect of the invention, however, the substrate used therein is a silicon or a silicon carbide substrate, and the surface thereof has crystallographic orientation as such that its plane normal axis is set along the <001> crystallographic orientation, with the {001} planes accounting for 10% or less of the entire area of the surface of the substrate. By thus providing undulations on the surface of the substrate and by thus controlling the ratio of the planar planes remaining on the surface of the substrate in this manner, the internal stress of the silicon carbide that is formed by deposition on the substrate can be controlled.

A crystallographic (001) plane generates a tensile stress with respect to the film as it grows in the crystallographic <001> direction. However, by forming undulations on the surface of the substrate and by thus increasing the ratio of (111) planes, a compression stress, which cancels out the tensile stress of the (001) plane, can be intentionally generated as to relax the in-plane stress. For instance, by using an undulated substrate in which the ratio of the (001) planes is controlled as such to account for 10% or less of the entire surface of the substrate, and in which the undulations are formed as such that they may have tilted planes inclusive of (111) planes and the like in such a manner that the growing crystalline phases may collide with each other, a tensile stress generates in the crystallographic <001> direction while a compression stress generates in a direction perpendicular to the <001> plane as to cancel out each other. In this manner, the stress can be controlled. Ideally, the {001} planes account, in the lower end, for 0% of the area of the entire surface of the substrate.

Third Aspect

Similar to the first aspect of the present invention described above, in the third aspect of the present invention, used as the substrate for depositing thereon silicon carbide is a substrate having a plurality of undulations extended approximately in parallel with each other on the surface thereof, said undulations having a center line average in a range of from 3 to 1,000 nm, and having tilted planes having a tilt angle in a range of from 1° to 54.7°. The reasons for limiting the center line average of the undulations above to a certain range, for setting a preferred range thereof; or the reasons for limiting the tilt angle of the tilted planes of the undulations, for setting a preferred range thereof; as well as the other points that are set in common, are the same as those described above in the first aspect of the present invention. In the third aspect of the invention, however, the substrate used therein is a silicon or a cubic silicon carbide substrate, and the surface thereof has crystallographic orientation as such that its plane normal axis is set along the <111> crystallographic orientation, with the {111} planes accounting for less than 3% of the entire area of the surface of the substrate. By thus providing undulations on the surface of the substrate and by thus controlling the ratio of the planar planes remaining on the surface of the substrate in this manner, the internal stress of the silicon carbide that is formed by deposition on the substrate can be controlled in a manner similar to the case as described in the second aspect above. Ideally, the {111} planes account, in the lower end, for 0% of the area of the entire surface of the substrate.

Fourth Aspect

Similar to the first aspect of the present invention described above, in the fourth aspect of the present invention, used as the substrate for depositing thereon silicon carbide is a substrate having a plurality of undulations extended approximately in parallel with each other on the surface thereof, said undulations having a center line average in a range of from 3 to 1,000 nm, and having tilted planes having a tilt angle in a range of from 1° to 54.7°. The reasons for limiting the center line average of the undulations above to a certain range, for setting a preferred range thereof; or the reasons for limiting the tilt angle of the tilted planes of the undulations, for setting a preferred range thereof; as well as the other points that are set in common, are the same as those described above in the first aspect of the present invention. In the fourth aspect of the invention, however, the substrate used therein is a hexagonal silicon carbide substrate, and the surface thereof has crystallographic orientation as such that its plane normal axis is set along the <1,1,-2,0> crystallographic direction, with the {1,1,-2,0} planes accounting for 10% or less of the entire area of the surface of the substrate. By thus providing undulations on the surface of the substrate and by thus controlling the ratio of the planar planes remaining on the surface of the substrate in this manner, the internal stress of the silicon carbide that is formed by deposition on the substrate can be controlled in a manner similar to the case as described in the second aspect above. Ideally, the {1,1,-2,0} planes account, in the lower end, for 0% of the area of the entire surface of the substrate.

Fifth Aspect

Similar to the first aspect of the present invention described above, in the fifth aspect of the present invention, used as the substrate for depositing thereon silicon carbide is a substrate having a plurality of undulations extended approximately in parallel with each other on the surface thereof, said undulations having a centerline roughness in a range of from 3 to 1,000 nm, and having tilted planes having a tilt angle in a range of from 1° to 54.7°. The reasons for limiting the center line average of the undulations above to a certain range, for setting a preferred range thereof; or the reasons for limiting the tilt angle of the tilted planes of the undulations, for setting a preferred range thereof; as well as the other points that are set in common, are the same as those described above in the first aspect of the present invention. In the fifth aspect of the invention, however, the substrate used therein is a hexagonal silicon carbide substrate, and the surface thereof has crystallographic orientation as such that its plane normal axis is set along the <0,0,0,1> crystallographic direction, with the {0,0,0,1} planes accounting for 3% or less of the entire area of the surface of the substrate. By thus providing undulations on the surface of the substrate and by thus controlling the ratio of the planar planes remaining on the surface of the substrate in this manner, the internal stress of the silicon carbide that is formed by deposition on the substrate can be controlled in a manner similar to the case as described in the second aspect above. Ideally, the {0,0,0,1} planes account, in the lower end, for 0% of the area of the entire surface of the substrate.

Sixth Aspect

According to the sixth aspect of the present invention, silicon carbide is deposited on at least a part of the surface of the substrate from a vapor phase or a liquid phase. Any known methods for depositing silicon carbide from a vapor phase or a liquid phase can be used as they are for the deposition.

As the gaseous source material for depositing silicon carbide from a vapor phase, usable are the silane based gaseous compounds such as dichlorosilane ($SiH_2Cl_2$), $SiH_4$, $SiCl_4$, $SiHCl_3$, etc. As the gaseous source material for carbon, usable are gaseous hydrocarbon such as acetylene ($C_2H_2$), $CH_4$, $C_2H_6$, $C_3H_8$, etc.

As a liquid phase process, there can be mentioned a method comprising melting a polycrystalline or amorphous silicon carbide, or a method comprising producing silicon carbide from a silicon source and a carbon source.

Seventh Aspect

According to the seventh aspect of the present invention, there is provided, in the method for producing silicon carbide in accordance with any of the second to fifth aspects of the present invention, a method characterized by that, in a cross section orthogonal to an orientation along which the undulations are extended, portions at which neighboring inclined planes are brought in contact with each other are in a curve shape. The portion at which the neighboring inclined planes are brought in contact with each other refers to a portion corresponding to the grooves and the ridges of the undulations extended on the surface, and the bottom of the grooves as well as the apex of the ridges yield a curved cross section. This state can be understood from the AFM image shown in FIG. 4. More specifically, the cross sectional shape of the undulations need not yield a constant wavelength or wave height, but it yields some kind of a sinusoidal curve. The planar defect density can be reduced by providing undulations having curved cross sections at the bottom portion of the grooves and at the apex portion of the ridges.

The undulations having specific shapes as described above are formed on the surface of a substrate by means of, for instance, photolithography, press working, laser processing, ultrasonic process, polishing, etc. Any method can be employed so long as the surface of the substrate yields a final morphology as such to effectively reduce or extinguish the anti phase boundaries as described in the aspects of the present invention.

By using photolithograpy to form a desired mask pattern to be transferred, a desired undulated shape can be formed on the substrate. Furthermore, the width of the undulations can be controlled by changing, for instance, the line width of the pattern; whereas the depth and the angle of the tilted plane can be controlled by controlling the selectivity ratio of the resist and the substrate. In case of forming a substrate having a curved shape for the portion at which the tilted planes are brought into contact with each other in the cross section perpendicular to the orientation along which the undulations are extended on the surface of the substrate, an undulated pattern having a curved shape (wavy shape) can be obtained by transferring a pattern to the resist, and by then reflow of the resist by heat treatment.

By using press working, a desired undulated shape can be formed on the substrate by forming the pressing mold into the desired shape. By thus forming various shapes, a variety of undulated shapes can be formed on the substrate.

The use of laser process or ultrasonic processing enables a still finer etching of the substrate because the undulations are directly formed on the substrate.

By using polishing, the width and the depth of the undulations can be controlled by varying the size of the abrasive grains and the working pressure. In case of producing a substrate having provided thereon an undulated pattern along one direction, the polishing is applied only on one direction.

By employing a dry etching process, the width and the depth of the undulations can be controlled by varying the conditions of etching and the shape of the etching mask. In case of forming a substrate having a curved shape for the portion at which the tilted planes are brought into contact with each other in the cross section perpendicular to the orientation along which the undulations are extended on the surface of the substrate, a wave-like pattern having curved cross section can be obtained by aligning the etching mask at a distance from the substrate onto which the pattern is to be transferred, because etching proceeds diffused between the mask and the substrate. Otherwise, a mask having a mask window with a trapezoidal cross section extended to the side of the substrate on which the pattern is to be transferred.

Eighth Aspect

According to the eighth aspect, there is provided a single crystal silicon carbide having a planar defect density of $1,000/cm^2$ or lower. A single crystal silicon carbide is well known in the art, but the single crystal silicon carbide known heretofore had planar defects at a density exceeding $10^4/cm^2$ (see, for instance, A. L. Syrkin et al., Inst. Phys. Conf. Ser. No.142, p189). In contrast to the above, the single crystal silicon carbide according to the present invention has a planar defect density of $1,000/cm^2$ or lower, and preferably, $100/cm^2$ or lower. The lower limit of the planar defect density is ideally $0/cm^2$ but in practice, the planar defect is present at a density of about $0.1/cm^2$. Because such a single crystal silicon carbide has a small crystal boundary density, and exhibits extremely superior electric characteristics it can be suitably used as a semiconductor substrate, a substrate for growing thereon a crystal (inclusive of seed crystals), or for other types of electronic devices.

Ninth Aspect

In accordance with the ninth aspect of the present invention, there is provided a single crystal silicon carbide having an internal stress of 100 MPa or lower. A single crystal silicon carbide is well known in the art, but a polycrystalline silicon carbide known heretofore yields an internal stress exceeding 100 MPa (reference can be made to, for instance, T. Shoki et al., SPIE. Int. Soc. Opt. Eng. Vol. 3748, p456). In contrast to above, the single crystal silicon carbide according to the present invention yields an internal stress of 100 MPa or lower, and preferably, 50 MPa or lower. The lower limit of the internal stress is ideally 0 MPa, and in practice, is 50 MPa. Such a single crystal silicon carbide suffers less warping and strain, and enables a silicon carbide having a flat surface. In case silicon carbide is curved due to the internal stress, the surface of the silicon carbide suffers strain. For instance, in case of newly depositing silicon carbide on a substrate using the silicon carbide above, the silicon carbide thus deposited succeeds the strain of the underlying substrate. However, if a flat and strain-free single crystal silicon carbide having an internal stress of 100 MPa or lower according to the present invention is used as the substrate, the problem mentioned above can be circumvented.

Tenth Aspect

A tenth aspect according to the present invention provides a single crystal silicon carbide having a planar defect density of $1,000/cm^2$ or lower and an internal stress of 100 MPa or lower. As described above, a single crystal silicon carbide known heretofore suffers planar defects exceeding a density of $10^4/cm^2$, and no single crystal having an internal stress of about 100 MPa has been found to date. In contrast to above, the single crystal silicon carbide according to the present invention has a planar defect density of $1,000/cm^2$ or lower, and preferably, $100/cm^2$ or lower, with an internal stress of 100 MPa or lower, and preferably, 50 MPa or lower. The lower limit of the planar defect density is ideally $0/cm^2$, but in practice, the planar defect is present at a density of about $0.1/cm^2$. Further, the lower limit of the internal stress is ideally 0 MPa, but in practice, the internal stress is 50 MPa. Such a single crystal silicon carbide exhibits extremely superior electric characteristics attributed to a low crystal boundary density, and can be suitably used as a semiconductor substrate, a substrate for growing thereon a crystal (inclusive of seed crystals), or for other types of electronic devices. At the same time, it enables a flat silicon carbide having extremely low warping and strain.

Eleventh Aspect

In accordance with the eleventh aspect of the present invention, there is provided a single crystal silicon carbide having an etch pit density equal to or less than $10/cm^2$ and a twin density equal to or less than $4 \times 10^{-4}\%$ by volume. The etch pit density affects the production yield of devices using a single crystal silicon carbide of the present invention and 90 percent or more of production yield can be accomplished for $0.01$ $cm^2$ of a device area when the etch pit density is equal to or less than $10/cm^2$. It is preferred from the viewpoint of improved production yield that the etch pit density is equal to or less than $1/cm^2$. The twin density is advantageous to be equal to or less than $4 \times 10^{-4}\%$ by volume because 90 percent or more of production yield can be accomplished for 0.01 cm² of a device area and the twin density is more advantageous to be equal to or less than 4×10⁻⁵% by volume.

Twelfth Aspect

In accordance with the twelfth aspect of the present invention, there is provided a method for producing the single crystal silicon carbide as described in the eighth to the eleventh aspects above, wherein, in any of the methods for producing a silicon carbide as described in one of the first to the seventh aspects above, silicon carbide is epitaxially grown by succeeding the crystallinity of the surface of the substrate. Any method for epitaxially growing silicon carbide can be employed so long as it is capable of limiting the propagation of the planar defects within the film in a confined crystallographic orientation while succeeding the crystallinity of the surface of the substrate. Specifically mentioned methods are, for instance, chemical vapor deposition (CVD) method, liquid phase epitaxial (LPE) growth method, sputtering method, molecular beam epitaxy (MBE) method, etc. Furthermore, in the case of employing a CVD process, the gaseous source material may be supplied simultaneously instead of employing the alternating gas supply method.

In accordance with the twelfth aspect of the present invention, the steps are introduced to the surface of the substrate on which silicon carbide is grown in such a manner that they might yield a statistically balanced density in the planes having a mirror plane symmetry. Hence, a silicon carbide film completely devoid of anti phase boundaries can be obtained because the anti phase boundaries unexpectedly introduced inside the silicon carbide layer attributed to the presence of the steps within the surface of the substrate effectively undergo association with each other. Furthermore, by the effect of introducing the offset angles, the growth regions all become regions with the same orientation. Thus, advantageously, even in case the discrete growth regions combine with each other as they grow, anti phase boundaries do not generate at the combined portions.

More specifically, in accordance with this method, the mismatch in lattice constant at the boundary between silicon and silicon carbide, which is known to be problematic on depositing a silicon carbide film on a silicon substrate, can be overcome while suppressing the generation of defects. Hence, the method enables the formation of a high quality silicon carbide.

BRIEF DESCRIPTION OF THE DRAWINGS

FIG. 7(a) to FIG. 7(c) are each a scanning electron micrograph of the surface of a 3C—SiC film grown on different types of substrates, wherein FIG. 7(a) shows a scanning electron micrograph of the surface of a 3C—SiC film grown on a surface-undulated substrate having a saw-tooth like shape;

FIG. 7(b) shows a scanning electron micrograph of the surface of a 3C—Sic film grown on a surface-undulated substrate having an extremely acute undulated surface; and FIG. 7(c) shows a scanning electron micrograph of the surface of a 3C—SiC film grown on a surface undulated substrate having a waved surface.

DESCRIPTION OF THE PREFERRED EMBODIMENTS

The present invention is described in further detail by making reference to non-limiting examples.

REFERENCE EXAMPLE

In order to confirm the effect of introducing an offset angle, cubic silicon carbide (referred to hereinafter as "3C—SiC") was grown on the (001) plane of a 6-inch diameter silicon substrate (referred to hereinafter as "Si") with no offset angle, as well as on the Si(001) planes each provided with an offset angle of 4° and 10°. The process of growing 3C—SiC comprises a step of carbonizing the surface of the substrate and a step of growing 3C—SiC by alternately supplying the gaseous source materials. In the carbonization step, the substrate thus processed in the manner above was heated from room temperature to 1,050° C. over a duration of 120 minutes in gaseous acetylene. After the carbonization step, 3C—SiC was grown on a substrate by exposing the surface of the substrate to an atmosphere by alternately changing dichlorosilane and acetylene. The detailed conditions of the carbonization step and the growth step for 3C—SiC are shown in Table 1 and Table 2, respectively.

Then, the density of the anti phase boundaries of each of the silicon carbides thus grown on the substrates was measured to obtain results as shown in Table 3.

TABLE 1

| | |
|---|---|
| Carbonization temperature | 1,050° C. |
| Temperature of introducing acetylene | 24° C. |
| Flow rate of gaseous acetylene | 10 sccm |
| Pressure | 20 mTorr |
| Time for elevating temperature | 120 minutes |

TABLE 2

| | |
|---|---|
| Growth temperature | 1,050° C. |
| Method for supplying the gases | Alternating supply of gaseous dichlorosilane and acetylene |
| Flow rate of gaseous acetylene | 10 sccm |
| Flow rate of gaseous dichlorosilane | 10 sccm |
| Interval in supplying each gas | 5 sec |
| Time duration of supplying each gas | 10 sec |
| Maximum pressure | 100 mTorr |
| Minimum pressure | 10 mTorr |
| Cycles of supplying the gas | 50,000 cycles |
| Film thickness of SiC | 4.5 to 5.9 μm |

TABLE 3

| Offset angle (degree) | APB density (cm$^{-2}$) |
|---|---|
| 0 | 8 × 10$^9$ |
| 4 | 2 × 10$^8$ |
| 10 | 1 × 10$^9$ |

The density of the anti phase boundaries (APB) was obtained by AFM observation of the surface of the 3C—SiC thus obtained. In this case, the surface of 3C—SiC was subjected to a thermal oxidation treatment, and to a further removal of the thermal oxidation film to thereby clearly distinguish the anti phase boundaries at the observation.

From the relation between the offset angles and the APB densities summarized in Table 3, it can be confirmed that the APB density decreases by introducing the offset angle, but that a complete removal thereof is not achieved.

Figure 2:
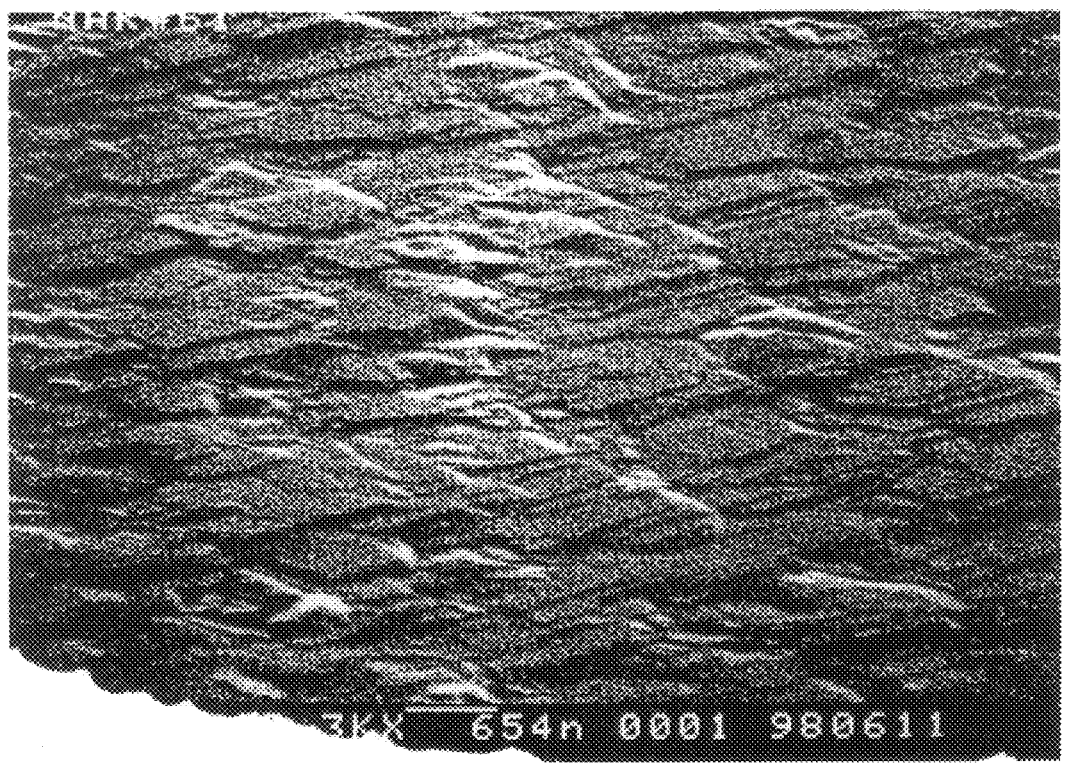
FIG. 2 is a scanning electron micrograph of the surface of a 3C—SiC film grown on a substrate provided with an offset angle of 4°.
Figure 3:
FIG. 3 is a scanning electron micrograph of the surface of a 3C—SiC film grown on a substrate having no offset angle.

In FIG. 2 is shown a scanning electron micrograph for the surface of the 3C—SiC film grown on a substrate provided with an offset angle of 4°, and in FIG. 3 is shown a scanning electron micrograph for the surface of the 3C—SiC film grown on a substrate with no offset angle.

From FIG. 2 and FIG. 3, it is confirmed that the terrace area is increased by introducing an offset angle, and that the growth in step flow mode is dominant in the growth of 3C—SiC. Thus, it can be understood that the propagation direction of the planar defects is limited to a specific crystallographic plane. However, these defects remain without being extinguished, because their directions of oriented defect propagation are in parallel with each other. Thus, it is impossible to completely eliminate these anti phase boundaries and the like defects.

Example 1

A 6-inch diameter Si(001) was used as the substrate for growing thereon a silicon carbide. Thus, the surface of the substrate was thermally oxidized, and a line and space pattern 1.5 μm in width and 1 μm in thickness was formed at a length of 60 mm by photolithograpy using a resist. The direction of the line and space pattern was set in parallel with the crystallographic <110> direction. Then, by heating the resulting substrate using a hot plate under the conditions shown in Table 4, there was obtained a resist pattern morphology deformed in such a manner that the line and space resist pattern is extended along the direction orthoigonal to the lines, and that the cross section thereof exhibits a wave-like resist pattern in which the apices and the bottoms of the undulations are connected by smooth curved lines. The cross section shape (undulations) and the planar shape (line and space) of the resist pattern were transferred to a silicon substrate by means of dry etching.

Thus, a substrate was obtained by removing the resist in a mixed solution of hydrogen peroxide and sulfuric acid. Similar to the case in FIG. 4, as a result of electron microscopic observation, the substrate was found to have a plurality of undulations extended in directions approximately in parallel with each other on the surface thereof, and, in the cross section perpendicular to the direction along which the undulations are extended, the portion at which the tilted planes are brought into contact with each other makes a curved shape. Furthermore, the undulations were found to have a center line average of 100 nm, and the average tilt angle of the tilted planes of the undulations was found to be 4°. The center line average and the tilt angle of the tilted planes of the undulations were measured by using an atomic force microscope (AFM).

Then, 3C—SiC was grown on the thus obtained substrate. The process of growing 3C—SiC comprises a step of carbonizing the surface of the substrate, and a step of growing 3C—SiC by alternately supplying the gaseous source materials. The detailed conditions for the step of growing 3C—SiC are shown in Table 5. The detailed conditions for the carbonization step are the same as those given in Table 1.

In the step of growing 3C—SiC, the film thickness of 3C—SiC was varied by changing the cycles of supplying the gaseous source material. Thus, the density of the anti phase boundaries that appear on the uppermost surface of each of the products was measured to obtain the results as shown in Table 6.

TABLE 4

| Heating temperature | 170° C. |
|---|---|
| Heating duration | 10 minutes |

TABLE 5

| Growth temperature | 1,050° C. |
|---|---|
| Method for supplying the gases | Alternating supply of gaseous dichlorosilane and acetylene |
| Flow rate of gaseous acetylene | 10 sccm |
| Flow rate of gaseous dichlorosilane | 10 sccm |
| Interval in supplying each gas | 5 sec |
| Time duration of supplying each gas | 10 sec |
| Maximum pressure | 100 mTorr |
| Minimum pressure | 10 mTorr |
| Cycles of supplying the gas | 100 to 50,000 cycles |

TABLE 6

| Film thickness (μm) | APB density (cm$^{-2}$) |
|---|---|
| 0.4 | 6 × 10$^7$ |
| 1.0 | 1 × 10$^5$ |
| 2.5 | 85 |
| 3.5 | 11 |
| 5.5 | 0 |

From the relation between the 3C—SiC film thickness and the APB densities summarized in Table 6, it can be understood that the planar defects collide with each other and diminish with progressive growth of 3C—SiC. As compared with the values obtained in a conventional method shown in Table 3, the distinguished effectiveness of the present invention can be clearly understood. Furthermore, the etch pit density and the twin density were studied on the 6-inch diameter 3C—SiC obtained in this Example in the following manner. Specifically, after exposing the surface of the 3C—SiC to fused KOH (at 500° C. for a duration of 5 minutes), the surface thereof was observed under an optical microscope. As a result, the number of etch pits in the entire surface of the 6-inch diameter 3C—SiC, which corresponds to the density of stacking fault, was found to be 1,700 pits or less, and the density thereof was found to be 10/cm$^2$ or lower. Furthermore, the pole figure observation was performed on the X-ray diffraction (XRD) rocking curve with respect to the crystallographic <111> orientations of the 3C—SiC, and the twin density was calculated from the intensity ratio of signals from the crystallographic {115} planes corresponding to the twin planes to those from the {111} planes of an ordinary single crystal plane. As a result, the twin density was found to be 4×10$^{-4}$% by volume or lower, i.e., a value corresponding to the detection limit.

Example 2

A 6-inch diameter Si (001) was used as the substrate for growing thereon a silicon carbide. Thus, a line and space pattern 1.5 μm in width and 1 μm in thickness was formed at a length of 60 mm by photolithograpy using a resist. The direction of the line and space pattern was set in parallel with the crystallographic <110> direction. Then, by heating the resulting substrate using a hot plate under the conditions shown in Table 7, there was obtained a resist pattern morphology deformed by reflow the resist. The cross section shape (undulations) and the planar shape (line and space) of the resist pattern were transferred to a Si substrate by means of dry etching. In this case, the heating temperature for the resist pattern was varied in a range of from 150° C. to 200° C. to change the tilt angle θ of the undulations as shown in Table 8.

Then, a substrate was obtained by removing the resist in a mixed solution of hydrogen peroxide and sulfuric acid. Similar to the case in FIG. 4, as a result of electron microscopic observation, the substrate was found to have a plurality of undulations extended in directions approximately in parallel with each other on the surface thereof, and, in the cross section perpendicular to the direction along which the undulations are extended, the portion at which the tilted planes are brought into contact with each other makes a curved shape. Furthermore, the undulations were found to have a center line average of 100 nm, and the average tilt angle of the tilted planes of the undulations was obtained as shown in Table 8. The center line average and the tilt angle of the tilted planes of the undulations were measured in manners similar to those described in Example 1.

Then, 3C—SiC was grown on the thus obtained substrate. The process of growing 3C—SiC comprises a step of carbonizing the surface of the substrate, and a step of growing 3C—SiC by alternately supplying the gaseous source materials. The detailed conditions for the carbonization step are the same as those given in Table 1, and the detailed conditions for the step of growing 3C—SiC are shown in Table 5.

For each of the 3C—SiCs thus grown on each of the substrates, the density of the anti phase boundaries that appear on the uppermost surface of each of the products was measured to obtain the results as shown in Table 8.

TABLE 7

| Heating temperature | 150 to 200° C. |
|---|---|
| Heating duration | 10 minutes |

TABLE 8

| Tilt angle of the undulations (deg) | APB density (cm$^{-2}$) |
|---|---|
| 0 | 8 × 10$^9$ |
| 1 | 30 |
| 4 | 0 |
| 10 | 45 |
| 50 | 320 |
| 60 | 1 × 10$^4$ |

From the relation between the tilt angles of the undulations and the APB densities summarized in Table 8, it can be understood that the APB density decreases in cases the tilt angle θ of the undulations of the crystallographic (111) planes make and angle in a range of 1° or higher but lower than 54.7°. Further, as compared with the values obtained in a conventional method shown in Table 3, it can be clearly understood that, when setting the same offset angle, the 3C—SiC grown on a substrate having provided thereon the undulations shows a distinguished decrease in APB density or a complete removal of anti phase boundaries density. Thus, the effectiveness of the present invention can be understood from those results. Furthermore, the etch pit density and the twin density were studied on the 3C—SiC grown on a undulation processed substrate having a tilt angle of 4 degrees in the following manner. Specifically, after exposing the surface of the 3C—SiC to fused KOH (at 500° C. for a duration of 5minutes), the surface thereof was observed under an optical microscope. As a result, the number of etch pits in the entire surface of the 6-inch square diameter 3C—SiC, which corresponds to the density of stacking fault, was found to be 1,528 pits, and the density thereof was found to be 8.65/cm$^2$. Furthermore, the pole figure observation was performed on the X-ray diffraction (XRD) rocking curve with respect to the crystallographic <111> orientations of the 3C—SiC, and the twin density was calculated from the intensity ratio of signals from the crystallographic {115} planes corresponding to the twin planes to those from the {111} planes of an ordinary single crystal plane. As a result, the twin density was found to be 4×10$^{-4}$% by volume or lower, i.e., a value corresponding to the detection limit.

Example 3

In Examples 1 and 2 above, 3C—SiC film was grown on a Si (001) plane used as the substrate. In Example 3, a substrate provided with undulations extended in parallel with the crystallographic <110> orientation was obtained on a (001) plane of single crystal cubic silicon carbide (3C—SiC) having a diameter of 6 inch, or a substrate provided with undulations extended in parallel with the crystallographic <0,0,0,1> direction was obtained on a (1,1,-2,0) plane of single crystal hexagonal silicon carbide. Thus, 3C-silicon carbide film or a hexagonal silicon carbide film was grown on each of the substrates above in a manner similar to that described in Example 1.

As a result of microscopic observation, each of the substrates was found to have a plurality of undulations extended approximately in parallel with the surface of the substrate, and to have a curved shape for the portion at which the tilted planes are brought into contact with each other. The undulations were found to have a center line average of 100 nm, and the average tilt angle of the tilted planes of the undulations was found to be 4°.

As a result, similar to the Example 1, the effectiveness of the present invention was confirmed in the present case using the above substrates.

Example 4

An attempt was made to prepare a substrate having provided with undulations extended in a orientation parallel to the crystallographic <110> direction by applying polish treatment to the surface of a Si (001) substrate 6 inch in diameter in a direction parallel to the crystallographic <110> direction thereof. For polishing, a commercially available diamond slurry consisting of particles about 15 μm in diameter (produced by Enguiss Co., Ltd. by the trademark of HIPRESS) and a commercially available polishing cloth (produced by Enguis Co., Ltd. by the trademark of M414) were used (Table 9). The cloth was uniformly impregnated with the diamond slurry, and polishing treatment in one direction was applied to a Si (001) substrate provided on a pad by reciprocating the substrate 300 times on the cloth over a distance of about 20 cm in a direction in parallel with the crystallographic <110> direction while applying a pressure of 0.2 kg/cm² to the entire Si (001) substrate. Thus, numerous polish flaws (scratches) were formed on the surface of the Si (001) substrate in a direction in parallel with the <110> direction.

TABLE 9

| Size of polishing abrasive grains | 15 μm in diameter (Enguiss Co., Ltd.) |
|---|---|
| Polishing cloth | M414 (Enguiss Co., Ltd.) |
| Load | 0.2 kg/cm² |
| Reciprocation times | 300 times |

Since abrasive grains and the like remain on the surface of the Si (001) substrate subjected to single direction polishing treatment, the surface of the substrate was cleaned in a 4:4:1 mixed solution of $NH_4OH$, $H_2O_2$, and $H_2O$ (temperature of the solution: 60° C.), and was further cleaned by alternately immersing three times each in a 1:1 mixed solution of $H_2SO_4$ and $H_2O_2$ (temperature of the solution: 80° C.) and in a 10% solution of HF. Finally, the substrate was rinsed with pure water.

Figure 1:
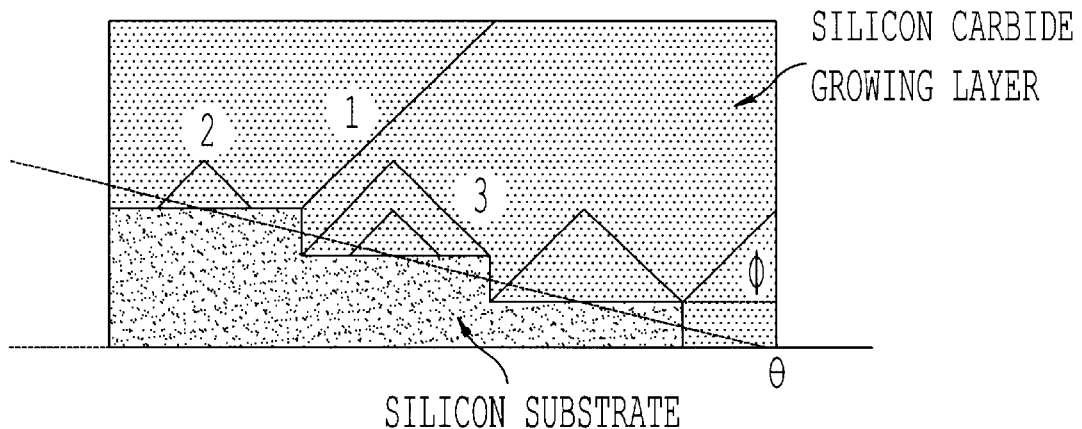
FIG. 1 is an explanatory diagram showing an anti phase boundary 1 and twin boundaries that are formed by an increase in step density on the interface between silicon carbide and silicon substrate.
Figure 4:
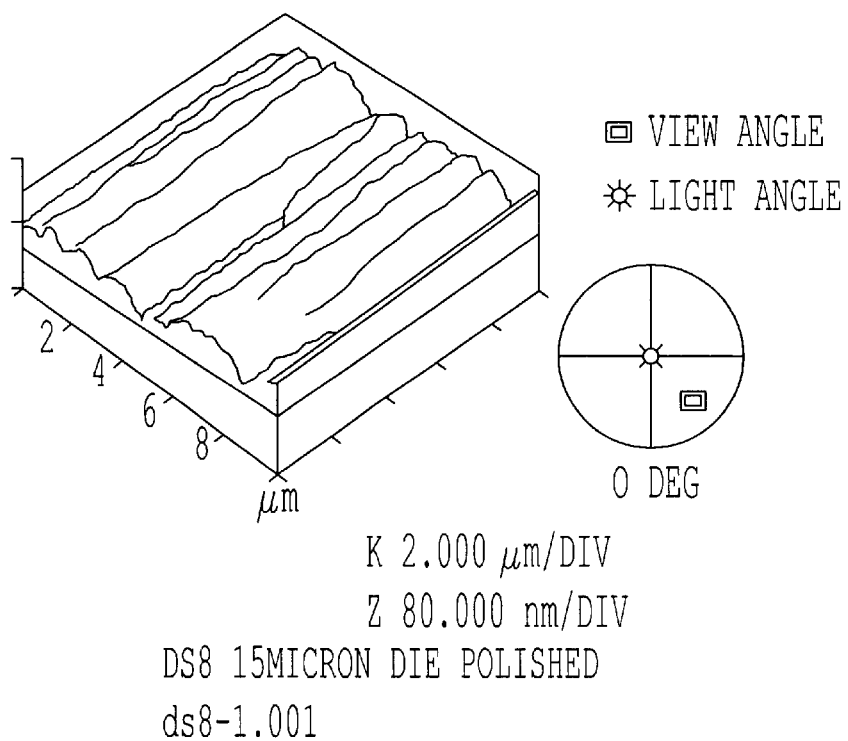
FIG. 4 is an AFM image of a surface of a substrate that is used in the present invention, said substrate having, in a cross section orthogonal to a direction along which the undulations are extended, portions at which neighboring inclined planes are brought in contact with each other being in a curve shape.

After cleaning, a thermally oxidized film about 1 μm in thickness was grown under the conditions shown in Table 10 on the surface of the thus obtained substrate subjected to single direction polishing treatment. Then, the thermally oxidized film was removed by using a 10% HF solution. The as-polished substrate itself is unfeasible as a substrate for growing thereon a crystal because fine irregularities and defects remain considerably on the surface in addition of the desired undulations. However, by forming a thermally oxidized film for a thickness of about 1 μm and removing it thereafter, the surface of the substrate can be etched for a depth of about 2,000 Å, and thus, an extremely smoothed undulations were formed by removing the fine irregularities. As observed from the cross section, the wavy irregularities are found to be unstable and irregular, however, the density is high. At least, the (001) planes accounted for 10% or less, and the surface shows irregularities on all over the surface. In average, the center line average was 20 nm. The grooves were formed with a depth of 30 to 50 nm, and with a width of about 0.5 to 1.5 μm. The tile angle was found to be in a range of from 3 to 5°. A representative AFM image is shown in FIG. 4.

TABLE 10

| Thermal oxidation temperature | 1,100° C. |
|---|---|
| Duration of oxidation | 5 hours |
| Flow rate of gaseous oxygen | 500 sccm |
| Thickness of oxidized film | 1 μm |

Thus, 3C—SiC was formed on the thus obtained substrate. The process of growing 3C—SiC comprises a step of carbonizing the surface of the substrate, and a step of growing 3C—SiC by alternately supplying the gaseous source materials. The detailed conditions for the carbonization step are the same as those given in Table 1, and the detailed conditions for the step of growing 3C—SiC are shown in Table 5.

As a result, the effect of using a substrate having provided thereon undulations formed in a direction parallel to the crystallographic <110> direction was obtained. That is, the anti phase boundary defects were found to be greatly reduced.

For instance, in contrast to the APB density of $8 \times 10^9$ cm² for a 3C—SiC film formed on a non-polished Si substrate, the APB density for the 3C—SiC formed on the Si substrate subjected to a single direction polishing was found to be in a range of 0 to 1/cm². The relation among the shape of the undulations and the APB density with respect to the size of the abrasive grains is summarized in Table 11. Further, the density of the undulations and the APB density are related to the repetition times of polishing as shown in Table 12.

TABLE 11

| Size of abrasive grains (diameter, μm) | Depth/width ratio (between protruded portions) (nm) | Tilt angle (degree) | APB density (cm⁻²) |
|---|---|---|---|
| 3 | 7/500 | 1 | 30 |
| 9 | 10/500 | 2 | 0 |
| 15 | 35/1,000 | 4 | 0 |

(Only the size of abrasive grains was varied under the conditions described above)

TABLE 12

| Reciprocation times of polishing | Density of undulations (%) | APB density (cm⁻²) |
|---|---|---|
| 50 | 50 | 100 |
| 100 | 80 | 20 |
| 300 | 100 | 0 |

(Only the size of reciprocation times of polishing was varied under the conditions described above)

The etch pit density and the twin density were studied in the following manner on the 3C—SiC grown on an undulation processed substrate subjected to a polish working with 300 reciprocation times and by using abrasive grains 15 μm in diameter. Specifically, after exposing the surface of the 3C—SiC to fused KOH (at 500° C. for a duration of 5 minutes), the surface thereof was observed under an optical microscope. As a result, the number of etched pits in the entire surface of the 6-inch diameter 3C—SiC, which corresponds to the density of stacking fault, was found to be 1,414 pits, and the density of the etched pits was found to be 8.00/cm². Furthermore, the pole figure observation was performed on the X-ray diffraction (XRD) rocking curve with respect to the crystallographic <111> direction of the 3C—SiC, and the twin density was calculated from the intensity ratio of signals from the crystallographic {115} planes corresponding to the twin planes to those from the {111} planes of an ordinary single crystal plane. As a result, the twin density was found to be $4 \times 10^{-4}$% by volume or lower, i.e., a value corresponding to the detection limit.

In the present example, a diamond slurry comprising abrasive grains 15 μm in diameter was used as the abrasive, but the size and the type of the abrasive grains are not limited to the above. It can be readily understood that a wider and milder undulation can be formed by increasing the grain size, but that the use of smaller abrasive grains provides narrower undulations. Effective undulations can be obtained by using abrasive grains having a diameter in a range of from 1 to 300 μm in diameter. Further, the pads to be used are not limited to the above. Still further, the load pressure between the substrate and the cloth during polishing, the polishing speed and the polishing time are not limited to the above. In the present case, Si (001) was used as the substrate, but a similar result can be obtained by using a cubic or a hexagonal silicon carbide. Furthermore, although undulations extended in the crystallographic <110> direction were formed on the Si (001) substrate, the direction is not only limited thereto.

Example 5

In order to overcome the problems of generating strain and warping on the silicon carbide layer, an attempt was made to prepare a substrate having provided with undulations extended in a direction parallel to the crystallographic <110> direction by applying polish treatment to the surface of a Si (001) substrate 6 inch in diameter in a direction parallel to the crystallographic <110> direction thereof. The existence probability of the Si (001) planes was controlled by changing the repetition times of polishing to confirm the effect of the invention. The polish working was applied to the Si (001) plane while varying the repetition times in a range of 30 to 300 times under the condition shown in Table 9. Numerous polish flaws (scratches) were formed on the surface of the Si (001) substrate in a direction parallel to the <110> direction.

Since abrasive grains and the like remain attached on the surface of the Si (001) substrate subjected to single direction polishing treatment, the surface of the substrate was cleaned in a 4:4:1 mixed solution of $NH_4OH$, $H_2O_2$, and $H_2O$ (temperature of the solution: 60° C.), and was further cleaned by alternately immersing three times each in a 1:1 mixed solution of $H_2SO_4$ and $H_2O_2$ (temperature of the solution: 80° C.) and in a 10% solution of HF. Finally, the substrate was rinsed with pure water.

After cleaning, a thermally oxidized film about 1 μm in thickness was grown by using a thermal treatment apparatus under the conditions shown in Table 10 on the surface of the thus obtained substrate subjected to single direction polishing treatment. Then, the thermally oxidized film was removed by using a 10% HF solution.

Thus, 3C—SiC was formed on the thus obtained substrate. The process of growing 3C—SiC comprises a step of carbonizing the surface of the substrate, and a step of growing 3C—SiC by alternately supplying the gaseous source materials. The detailed conditions for the carbonization step are the same as those given in Table 1, and the detailed conditions for the step of growing 3C—SiC are shown in Table 5. The internal stress and the APB density are related to the existence ratio of the Si (001) planes as shown in Table 13.

TABLE 13

| Ratio of Si (001) planes (%) | Internal stress (MPa) | APB density ($cm^{-2}$) |
|---|---|---|
| 0 | 20 | 0 |
| 3 | 20 | 5 |
| 5 | 30 | 10 |
| 10 | 35 | 15 |
| 20 | 140 | 20 |
| 50 | 150 | 100 |
| 100 | 250 | $8 \times 10^9$ |

As a result, an internal stress of 35 MPa or lower in the direction of compression within the SiC layer was obtained in case the Si (001) planes account for 10% or less in the Si (001) substrate used for growing thereon 3C—SiC. Referring to the table, on the other hand, an extremely high stress was found to generate in case the Si (001) planes account for 10% or more of the substrate. This effect has been obtained by providing undulations on the Si (001) planes and by controlling the existence of the (001) planes to 10% or less. Furthermore, the defect density tended to increase with increasing ratio of the Si (001) planes. Thus, preferred results were obtained for the defect density with decreasing ratio of the Si (001) planes. Furthermore, the etch pit density and the twin density were studied in the following manner on the 6-inch diameter 3C—SiC whose Si (001) planes were controlled as such to accounting for 10% or less of the entire surface. Specifically, after exposing the surface of the 3C—SiC to fused KOH (at 500° C. for a duration of 5 minutes), the surface thereof was observed under an optical microscope. As a result, the number of etch pits in the entire surface of the 6-inch diameter 3C—SiC, which corresponds to the density of stacking fault, was found to be 1,548 pits, and the density thereof was found to be $8.76/cm^2$. Furthermore, the pole figure observation was performed on the X-ray diffraction (XRD) rocking curve with respect to the crystallographic <111> orientations of the 3C—SiC, and the twin density was calculated from the intensity ratio of signals from the crystallographic {115} planes corresponding to the twin planes to those from the {111} planes of an ordinary single crystal plane. As a result, the twin density was found to be $4 \times 10^{-4}$% by volume or lower, i.e., a value corresponding to the detection limit.

Similar to the case in FIG. 4, as a result of electron microscopic observation, the substrate was found to have a plurality of undulations extended in directions approximately in parallel with each other on the surface thereof, and, in the cross section perpendicular to the direction along which the undulations are extended, the portion at which the tilted planes are brought into contact with each other makes a curved shape. Furthermore, the undulations were found to have a center line average in a range of 20 to 40 nm, and the average tilt angle of the tilted planes of the undulations was found to be in a range of 3 to 50.

As described above, the crystal growth was performed on a Si (001) plane. Similarly, the internal stress within the deposited SiC layer was found to be suppressed to 100 MPa or lower by controlling the ratio of (111) planes to 3% lower in a Si (111) plane, or by controlling the ratio of (1,1,-2,0) planes to 10% or lower in the (1,1,-2,0) plane of a hexagonal silicon carbide, or by controlling the ratio of (0,0,0,1) planes to 3% or lower in the (0,0,0,1) plane of a hexagonal silicon carbide.

Example 6

In order to overcome the problems of generating strain and warping on the silicon carbide layer, an attempt was made to prepare a substrate having provided with undulations extended in a direction parallel to the crystallographic <110> orientation by applying polish treatment to the surface of a Si (001) substrate 6 inch in diameter in a orientation parallel to the crystallographic <110> direction thereof. The center line average of the Si (001) plane was controlled by changing the grain diameter of the abrasive grains to confirm the effect of the invention. The polish working was applied to the Si (001) plane under the conditions shown in Table 9. Numerous polish flaws (scratches) were formed on the surface of the Si (001) substrate in a direction parallel to the <110> direction.

Since abrasive grains and the like remain attached on the surface of the Si (001) substrate subjected to single direction polishing treatment, the surface of the substrate was cleaned in a 4:4:1 mixed solution of $NH_4OH$, $H_2O_2$, and $H_2O$ (temperature of the solution: 60° C.), and was further cleaned by alternately immersing three times each in a 1:1 mixed solution of $H_2SO_4$ and $H_2O_2$ (temperature of the solution: 80° C.) and in a 10% solution of HF. Finally, the substrate was rinsed with pure water.

After cleaning, a thermally oxidized film about 1 μm in thickness was grown by using a thermal treatment apparatus under the conditions shown in Table 10 on the surface of the thus obtained substrate subjected to single direction polishing treatment. Then, the thermally oxidized film was removed by using a 10% HF solution.

Thus, 3C—SiC was formed on the thus obtained substrate. The process of growing 3C—SiC comprises a step of carbonizing the surface of the substrate, and a step of growing 3C—SiC by alternately supplying the gaseous source materials. The detailed conditions for the carbonization step are the same as those given in Table 1, and the detailed conditions for the step of growing 3C—SiC are shown in Table 5. The internal stress and the APB density are related to the center line average of the Si (001) planes as shown in Table 14.

TABLE 14

| Center line average of Si (001) planes (nm) | Internal stress (MPa) | APB density ($cm^{-2}$) |
|---|---|---|
| 1 | 150 | 250 |
| 2 | 100 | 200 |
| 3 | 80 | 100 |
| 5 | 60 | 50 |
| 10 | 40 | 30 |
| 30 | 30 | 0 |
| 50 | 20 | 0 |
| 100 | 30 | 20 |
| 200 | 50 | 50 |
| 400 | 70 | 100 |

With a center line average of 3 nm or less, the internal stress is high and the planar defect density also is high. With a center line average in a range of from 3 nm to 10 nm, the internal stress decreases and the planar defect density is also lowered. With a center line average exceeding 100 nm, however, the planar defect density tends to increase. Furthermore, the etch pit density and the twin density were studied in the following manner on the 6-inch diameter 3C—SiC whose center line average of the Si (001) plane was controlled in a range of 30 to 50 nm. Specifically, after exposing the surface of the 3C—SiC to fused KOH (at 500° C. for a duration of 5 minutes), the surface thereof was observed under an optical microscope. As a result, the number of etch pits in the entire surface of the 6-inch diameter 3C—SiC, which corresponds to the density of stacking fault, was found to be 1,683 pits, and the density thereof was found to be 9.52/$cm^2$. Furthermore, the pole figure observation was performed on the X-ray diffraction (XRD) rocking curve with respect to the crystallographic <111> orientations of the 3C—SiC, and the twin density was calculated from the intensity ratio of signals from the crystallographic {115} planes corresponding to the twin planes to those from the {111} planes of an ordinary single crystal plane. As a result, the twin density was found to be $4 \times 10^{-4}$% by volume or lower, i.e., a value corresponding to the detection limit. Thus, the effect of the present invention is exhibited by providing undulations on the Si (001) plane, and by controlling the center line average of the plane in a range of from 3 nm to 100 nm.

Similar to the case in FIG. 4, as a result of AFM image observation, the substrate was found to have a plurality of undulations extended in directions approximately in parallel with each other on the surface thereof, and, in the cross section perpendicular to the direction along which the undulations are extended, the portion at which the tilted planes are brought into contact with each other makes a curved shape. Furthermore, the average tilt angle of the tilted planes of the undulations was found to be in a range of 3 to 5°.

In the present example, a Si (001) plane was used as the substrate, but it was confirmed that similar results are achievable by using a Si (111) plane, a (1,1,-2,0) plane of hexagonal silicon carbide, or a (0,0,0,1) plane of hexagonal silicon carbide.

Example 7

An attempt of reducing the strain of 3C—SiC was made by providing undulations on the surface and the back planes of a Si (001) substrate having a diameter of 6 inches. The undulations were formed by polishing under the conditions shown in Table 9. The center line average of the surface and the back planes was set to about 50 nm. A 3C—SiC was grown on the substrate. The process of growing 3C—SiC comprises a step of carbonizing the surface of the substrate, and a step of growing 3C—SiC by alternately supplying the gaseous source materials. The detailed conditions for the carbonization step are the same as those given in Table 1, and the detailed conditions for the step of growing 3C—SiC are shown in Table 5. The internal stress of the thus grown 3C—SiC was found to be extremely low as 10 MPa in the direction of compression. The stress generated on the surface and the back planes cancelled each other to reduce the formation of warping and strain, and enabled the growth of a favorable 3C—SiC. The effect of forming undulations on both surface and back planes are thus obtained.

Although the present example describes the case of using Si (100) plane, similar results are confirmed obtainable on a Si (111) plane, a (1,1,-2,0) plane of hexagonal silicon carbide, or a (0,0,0,1) plane of hexagonal silicon carbide.

Example 8

Figure 5:
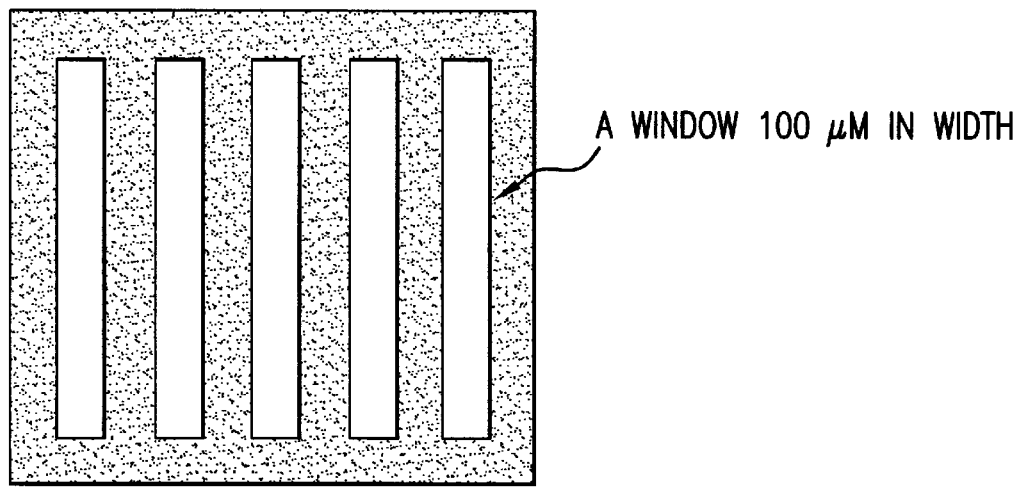
FIG. 5 is a schematic diagram of a quartz mask used in Example 8.
Figure 6:
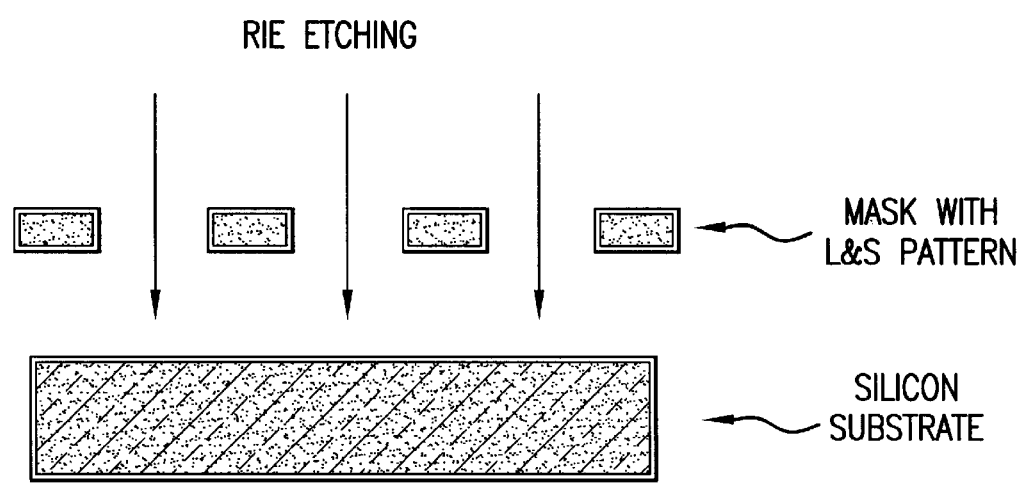
FIG. 6 is an explanatory diagram showing a relation between the silicon substrate and the mask.

From the examples above, it was found that high quality 3C—SiC can be obtained by forming undulations of a specified shape on the surface of the substrate. In the present example, the undulated shapes are formed by means of dry etching. First, a quartz mask as shown in FIG. 5 was prepared. The line and space pattern are provided at an interval of 100 μm to the mask. The longer side of the mask window is aligned in parallel with the crystallographic <110> orientation of the silicon substrate. The distance between the silicon substrate and the mask was set to 1 mm (FIG. 6). This setting was employed because, if the distance should be set to 0, a rectangular line and space pattern would be transferred to the silicon substrate. A RIE apparatus was used in the dry etching. Thus, etching was performed for 4 hours by flowing gaseous $CF_4$ and $O_2$ at a flow rate of 40 sccm and 10 sccm, respectively, while setting the power of the RF power source to 250 W and the vacuum degree between the electrodes to 8 Pa (see Table 15). As a result, stable wave-like undulations with a period of 200 μm, a depth of 8 μm (with a center line average in a range of 60 to 100 nm), and a tilt angle of 3 to 50 were transferred on the surface of the silicon substrate. The 3C—SiC formed on the surface of the substrate was found to yield a favorable planar defect density in a range of from 0 to 1/$cm^2$. Furthermore, the etch pit density and the twin density were studied in the following manner on the 6-inch diameter 3C—SiC grown on a substrate having provided thereon the wavy undulations by means of RIE (Reactive Ion Etching). Specifically, after exposing the surface of the 3C—SiC to fused KOH (at 500° C. for a duration of 5 minutes) the surface thereof was observed under an optical microscope.

As a result, the number of etch pits in the entire surface of the 6-inch diameter 3C—SiC, which corresponds to the density of stacking fault, was found to be 1,290 pits, and the density thereof was found to be 7.30/cm². Further, the pole figure observation was performed on the X-ray diffraction (XRD) rocking curve with respect to the crystallographic <111> orientations of the 3C—SiC, and the twin density was calculated from the intensity ratio of signals from the crystallographic {115} planes corresponding to the twin planes to those from the {111} planes of an ordinary single crystal plane. As a result, the twin density was found to be $4 \times 10^{-4}$% by volume or lower, i.e., a value corresponding to the detection limit.

TABLE 15

| | |
|---|---|
| RF power | 250 W (using 300-mm diameter electrode) |
| Pressure | 8 Pa |
| Etching gas | $CF_4$ 40 sccm and $O_2$ 10 sccm |
| Time | 4 hours |

Although a quartz mask was used in the example above, the material for the mask is not only limited thereto. Furthermore, although the interval of the line and space pattern was set to 100 μm, it can be set as desired in a range of 10 to 1,000 μm. In case of perforating a finer window on the mask, the strength of the mask must be considered. However, by providing intervals with 1:2 or 1:3 ratios, the strength of the mask can be pertained, and the dry etching can be performed for several times to form undulations with higher density while deviating the position of the mask. Although a distance of 1 mm was set between the mask and the substrate onto which the pattern was transferred, the distance is not only limited thereto, because the distance is set with the purpose of forming wave-like transferred patterns. Any distance may be employed so long as a wave-like transferred pattern is obtained. It is also possible to transfer a wave-like pattern by means of etching using a mask having a window with a trapezoidal cross section.

Example 9

Figure 7A:

In case a substrate having provided with an undulation having a saw-tooth like shape is used, as shown in FIG. 7(a), there occurs a problem that defects such as etch pits form occasionally on the acute concave portions, and that the defects are propagated to the surface.

Thus, an attempt was made to provide wave-like surface shapes to the undulations, thereby reducing the acute concave portions to result in a suppressed generation of the defects.

The saw-tooth like undulations were formed by single direction polishing. (This method is the same as that employed in the Examples above, except that the final oxidation treatment is omitted.) Thus, an attempt of preparing a substrate having provided with undulations extended in a direction parallel to the crystallographic <110> direction was made by applying polish working on a Si (001) substrate 6-inch in diameter in the direction parallel to the crystallographic <110> direction. For the polish working, a commercially available diamond slurry consisting of particles about 15 μm in diameter (produced by Enguiss Co., Ltd. by the trademark of HIPRESS) and a commercially available polishing cloth (produced by Enguis Co., Ltd. by the trademark of M414) were used (Table 9). The cloth was uniformly impregnated with the diamond slurry, and polishing treatment in one direction was applied to a Si (001) substrate provided on a pad by reciprocating the substrate 300 times on the cloth over a distance of about 20 cm in a direction in parallel with the crystallographic <110> direction while applying a pressure of 0.2 kg/cm² to the entire Si (001) substrate. Thus, numerous polish flaws (scratches) were formed on the surface of the Si (001) substrate in a direction in parallel with the <110> direction.

Since abrasive grains and the like remain attached on the surface of the Si (001) substrate subjected to single direction polishing treatment, the surface of the substrate was cleaned in a 4:4:1 mixed solution of $NH_4OH$, $H_2O_2$, and $H_2O$ (temperature of the solution: 60° C.), and was further cleaned by alternately immersing three times each in a 1:1 mixed solution of $H_2SO_4$ and $H_2O_2$ (temperature of the solution: 80° C.) and in a 10% solution of HF. Finally, the substrate was rinsed with pure water.

Figure 7C:
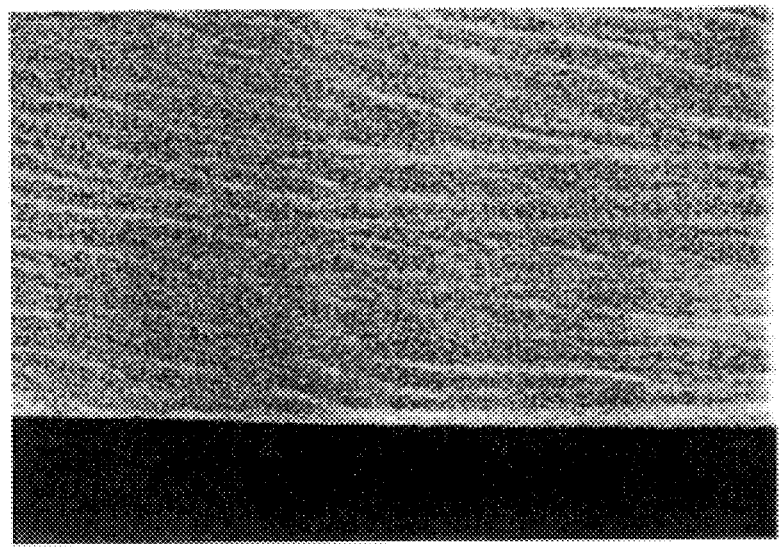
Figure 7B:
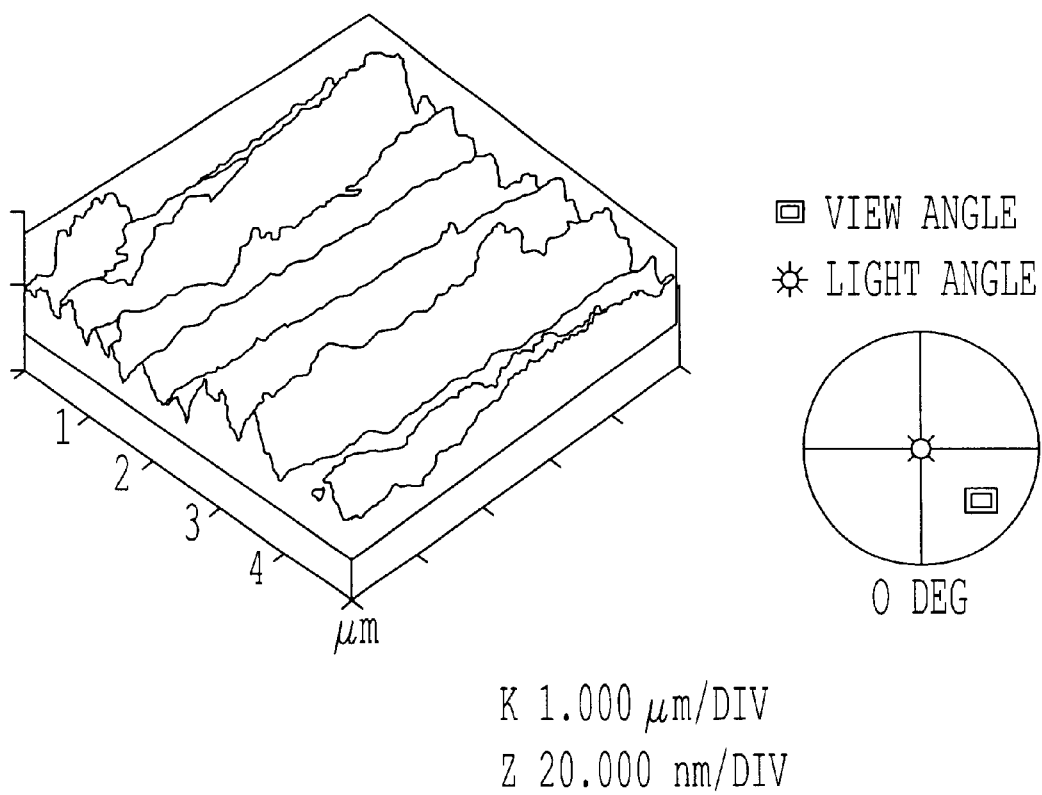

Thus, an extremely acute undulation shape (i.e., a saw-tooth like shape) was obtained on the as-polished surface of the substrate (see FIG. 7(b)).

Then wave-like undulations were obtained by applying thermal oxidation treatment to the undulated surface of the thus obtained undulated surface having provided thereon the saw-tooth like undulations formed by single direction polishing in order to relax the wave shape.

After cleaning the undulation substrate after polishing, a thermally oxidized film about 1 μm in thickness was grown under the conditions shown in Table 10 on the surface of the thus obtained substrate subjected to single direction polishing treatment using a heat treatment device. Then, the thermally oxidized film was removed by using a 10% HF solution. The as-polished substrate itself is unfeasible as a substrate for growing thereon a crystal because fine irregularities and defects remain considerably on the surface in addition of the desired undulations. However, by forming a thermally oxidized film for a thickness of about 1 μm and removing it thereafter, the surface of the substrate can be etched for a depth of about 2,000 Å, and thus, an extremely smoothed undulations were formed by removing the fine irregularities. As observed from the cross section, the wavy irregularities are found to be unstable and irregular, however, the density is high. At least, the (001) planes accounted for 10% or less, and the surface shows irregularities on all over the surface. In average, the center line average was 20 nm. The grooves were formed with a depth of 30 to 50 nm, and with a width of about 0.5 to 1.5 μm. The tile angle was found to be in a range of from 3 to 5°. A representative AFM image is shown in FIG. 4.

Then, a 3C—SiC was grown on the substrate. The process of growing 3C—SiC comprises a step of carbonizing the surface of the substrate, and a step of growing 3C—SiC by alternately supplying the gaseous source materials. The detailed conditions for the carbonization step are the same as those given in Table 1, and the detailed conditions for the step of growing 3C—SiC are shown in Table 5.

Thus, a wave-like undulation was formed by forming saw-tooth like undulations by single direction polishing, and the surface was relaxed by applying thereafter a thermal oxidation treatment to the undulations provided to the surface.

By thus forming a substrate having provided with wave-like undulations, the acute concave portions were ameliorated to provide milder shapes. Further, wave-like undulations were formed by dry etching to compare with the substrate thus obtained above.

As a result of growing SiC on the thus obtained substrate provided with wave-like undulations, no defects as such generating on acute concave portions of a substrate having saw-tooth like undulations were observed (FIG. 7(c)).

The defect density is given in Table 16.

TABLE 16

|  | Saw-toothlike undulation | Wave-like undulation | Wave-like undulation (dry etching) |
| --- | --- | --- | --- |
| Defect density | 1,000/cm$^2$ | 0 to 5/cm$^2$ | 0 to 5/cm$^2$ |

The etch pit density and the twin density were studied in the following manner on the 3C—SiC grown on a substrate having provided thereon wave-lie undulations. Specifically, after exposing the surface of the 3C—SiC to fused KOH (at 500° C. for a duration of 5 minutes), the surface thereof was observed under an optical microscope. As a result, the number of etch pits in the entire surface of the 6-inch square diameter 3C—SiC, which corresponds to the density of stacking fault, was found to be 1,700 pits or less, and the density thereof was found to be 10/cm$^2$ or lower. Furthermore, the pole figure observation was performed on the X-ray diffraction (XRD) rocking curve with respect to the crystallographic <111> orientations of the 3C—SiC, and the twin density was calculated from the intensity ratio of signals from the crystallographic {115} planes corresponding to the twin planes to those from the {111} planes of an ordinary single crystal plane. As a result, the twin density was found to be $4 \times 10^{-4}$% by volume or lower, i.e., a value corresponding to the detection limit. On the other hand, the number of etch pits in the entire surface of 6-inch square diameter 3C—SiC grown on a substrate provided with saw-tooth like undulations was found to be 284,356 pits. Similarly, the density of the pits and that of the twins were found to be 1,609/cm$^2$ and $6 \times 10^{-3}$% by volume.

By forming wave-like undulations as described above, the generation density of defects at the boundary of the substrate was found to be greatly decreased. In accordance with the present invention, the etch pit density and the incorporation of twins generated on the surface of the substrate can be reduced to 10/cm$^2$ or lower and to $4 \times 10^{-4}$% by volume or lower, respectively. Further, it is possible to reduce the etch pit density and the incorporation of twins on the surface of the substrate over a large area as large as 6 inch in diameter to 10/cm$^2$ or lower and to $4 \times 10^{-4}$% by volume or lower, respectively.

The present invention has been described in detail by making reference to Examples above, but it should be understood that the present invention is not only limited thereto. For instance, the conditions for forming the 3C—SiC film, the film thickness, etc., are not only limited to those described in the Examples above. Furthermore, although the invention has been explained for a case using a substrate 6 inch in diameter, the effect of the present invention not only is limited to 6-inch diameter substrates, but is obtainable similarly on, for instance, larger substrates having a diameter of 8 inch, or on smaller substrates 4 inch or less in diameter.

As described above, in accordance with the method for producing silicon carbide according to the present invention, a silicon carbide film reduced in internal stress and strain of the silicon carbide layer can be obtained by effectively reducing or extinguishing the anti phase boundaries.

Furthermore, since the silicon carbide film according to the present invention contains grain boundaries at a low density, it exhibits an extremely superior electrical properties, and it is widely applicable to various types of electronic devices.

The present disclosure relates to the subject matter contained in Japanese Patent Application Nos. 2000-106292 and 2000-365443, which is expressly incorporated herein by reference in its entirety.

What is claimed is:

1. A process for preparation of silicon carbide by depositing silicon carbide on at least a part of a surface of a substrate having on its surface undulations extending approximately in parallel with each other, wherein said undulations have a center line average as defined in JIS B0601 in a range of from 3 to 1,000 nm, gradients of inclined planes of said undulations are in a range of from 1° to 54.7°, and, in a cross section orthogonal to a direction along which the undulations are extended, portions at which neighboring inclined planes are brought in contact with each other are in a curve shape.

2. The process for preparation according to claim 1, wherein said silicon carbide is deposited from a vapor phase or a liquid phase.

3. A process for preparation of silicon carbide by depositing silicon carbide on at least a part of a surface of a substrate having on its surface undulations extending approximately in parallel with each other, wherein said undulations have a center line average as defined in JIS B0601 in a range of from 3 to 1,000 nm, gradients of inclined planes of said undulations are in a range of from 1° to 54.7°, and said substrate is made of silicon or silicon carbide having a surface with a plane normal axis of <001> crystallographic orientation and with an area of {001} planes equal to or less than 10% of the entire area of the surface of said substrate.

4. The process for preparation according to claim 3, wherein, in a cross section orthogonal to a direction along which the undulations are extended, portions at which neighboring inclined planes are brought in contact with each other are in a curve shape.

5. The process for preparation according to claim 3, wherein said silicon carbide is deposited from a vapor phase or a liquid phase.

6. A process for preparation of silicon carbide by depositing silicon carbide on at least a part of a surface of a substrate having on its surface undulations extending approximately in parallel with each other, wherein said undulations have a center line average as defined in JIS B0601 in a range of from 3 to 1,000 nm, gradients of inclined planes of said undulations are in a range of from 1° to 54.7°, and said substrate is made of silicon or cubic silicon carbide having a surface with a plane normal axis of <111> crystallographic orientation and with an area of {111} planes equal to or less than 3% of the entire area of the surface of said substrate.

7. The process for preparation according to claim 6, wherein said silicon carbide is deposited from a vapor phase or a liquid phase.

8. The process for preparation according to claim 6, wherein, in a cross section orthogonal to a direction along which the undulations are extended, portions at which neighboring inclined planes are brought in contact with each other are in a curve shape.

9. A process for preparation of silicon carbide by depositing silicon carbide on at least a part of a surface of a substrate having on its surface undulations extending approximately in parallel with each other, wherein said undulations have a center line average as defined in JIS B0601 in a range of from 3 to 1,000 nm, gradients of inclined planes of said undulations are in a range of from 1° to 54.7°, and said substrate is made of hexagonal silicon carbide having a surface with a plane normal axis of <1,1,−2,0> crystallographic orientation and with an area of {1,1,−2,0} planes equal to or less than 10% of the entire area of the surface of said substrate.

10. The process for preparation according to claim 9, wherein said silicon carbide is deposited from a vapor phase or a liquid phase.

11. The process for preparation according to claim 9, wherein, in a cross section orthogonal to a direction along which the undulations are extended, portions at which neighboring inclined planes are brought in contact with each other are in a curve shape.

12. A process for preparation of silicon carbide by depositing silicon carbide on at least a part of a surface of a substrate having on its surface undulations extending approximately in parallel with each other, wherein said undulations have a center line average as defined in JIS B0601 in a range of from 3 to 1,000 nm, gradients of inclined planes of said undulations are in a range of from 1° to 54.7°, and said substrate is made of hexagonal silicon carbide having a surface with a plane normal axis of <0,0,0,1> crystallographic orientation and with an area of {0,0,0,1} planes equal to or less than 3% of the entire area of the surface of said substrate.

13. The process for preparation according to claim 12, wherein said silicon carbide is deposited from a vapor phase or a liquid phase.

14. The process for preparation according to claim 12, wherein, in a cross section orthogonal to a direction along which the undulations are extended, portions at which neighboring inclined planes are brought in contact with each other are in a curve shape.

* * * * *